United States Patent [19]

Wright

[11] Patent Number: 5,523,247
[45] Date of Patent: Jun. 4, 1996

[54] METHOD OF FABRICATING SELF-ALIGNED PLANARIZED WELL STRUCTURES

[75] Inventor: Peter Wright, Sunnyvale, Calif.

[73] Assignee: Altera Corporation, San Jose, Calif.

[21] Appl. No.: 518,802

[22] Filed: Aug. 24, 1995

[51] Int. Cl.$^6$ ............................................. H01L 21/8238
[52] U.S. Cl. .................. 437/34; 437/57; 437/924; 437/70
[58] Field of Search ...................... 437/34, 56, 57, 437/70, 924; 148/DIG. 70, DIG. 102

[56] References Cited

U.S. PATENT DOCUMENTS

| | | | |
|---|---|---|---|
| 4,516,316 | 5/1985 | Haskell | 437/70 |
| 4,558,508 | 12/1985 | Kinney et al. | 437/34 |
| 4,929,565 | 5/1990 | Parrillo | 437/34 |
| 5,413,944 | 5/1995 | Lee | 437/57 |

*Primary Examiner*—Chandra Chaudhari
*Attorney, Agent, or Firm*—Fish & Neave; Robert R. Jackson; G. Victor Treyz

[57] ABSTRACT

A method of forming a planarized self-aligned integrated circuit structure suitable for forming CMOS circuitry is provided. The method involves using first and second barrier layers to define the dopant regions for first and second wells, respectively. The first barrier can be formed of a silicon nitride layer covered with a silicon oxide layer. The first barrier layer prevents doping of the silicon wafer except in those regions not covered by the first barrier layer (i.e., the first wells). The second barrier layer is formed by oxidizing the silicon wafer. Only the regions not covered by the first layer are oxidized. The second wells are defined by the second barrier layer. Because some of the silicon of the first wells is consumed to form the second barrier layer, the height of the first wells following the formation of the second barrier layer is less than that of the second wells. To equalize the height of the first and second wells, and thereby planarize the wafer, the height of the second wells is reduced to substantially the same height as the first wells. The second wells can be reduced to the same height as the first wells using wet silicon etching, dry silicon etching or oxidation followed by an oxide removal step.

10 Claims, 5 Drawing Sheets

METHOD OF FABRICATING SELF-ALIGNED PLANARIZED WELL STRUCTURES

BACKGROUND OF THE INVENTION

This invention relates to semiconductor integrated circuit fabrication techniques, and more particularly, to techniques for planarizing wafer surfaces during the fabrication of self-aligned integrated circuit well structures.

As integrated circuits become more complex, there is a need to produce circuits of ever-increasing size and density. However, fabricating more dense integrated circuits requires that the critical dimensions of the various integrated circuit components be reduced. As the dimensions of circuit components on a wafer are reduced, the topography of the surface of the wafer can become highly non-planar. However, such non-planar wafer topographies are undesirable, because non-planar wafer structures can make circuit fabrication difficult. For example, it is difficult to pattern non-planar layers during circuit fabrication due to the depth-of-field limitations of available photolithography tools.

Although techniques exist for maintaining a relatively planarized wafer surface during circuit fabrication, such techniques generally involve numerous additional processing steps and do not allow the formation of self-aligned structures. Self-aligned structures are desirable, because they can be formed using less wafer surface area than equivalent structures which are not self-aligned.

It is therefore an object of the present invention to provide an improved method of fabricating semiconductor integrated circuits.

It is a further object of the present invention to provide a method of fabricating a planar self-aligned integrated circuit structure suitable for use in forming complementary metal-oxide-semiconductor integrated circuits.

SUMMARY OF THE INVENTION

These and other objects of the invention are accomplished in accordance with the principles of the present invention by providing an improved method of forming self-aligned complementary wells suitable for forming complementary metal-oxide-semiconductor (CMOS) integrated circuits. The method involves using first and second barrier layers to define the dopant pattern for first and second wells, respectively. The first barrier can be formed of a silicon dioxide layer covered with a silicon nitride layer. The first wells are doped only where the silicon surface is not covered by the first barrier layer. The second barrier layer is formed by oxidizing the silicon wafer while the silicon nitride of the first barrier layer is still in place. Because silicon nitride acts as a diffusion barrier to oxygen, only the regions not covered by the first layer are oxidized. After the silicon nitride of the first barrier layer is removed, the second barrier layer is used to define the locations of the second wells, which are formed by implantation or diffusion. The dopant used to form the second wells is of the opposite conductivity type to the dopant used to form the first wells.

Because a portion of the silicon at the surface of the first wells is consumed during the formation of the second barrier layer, after the second barrier layer is formed the height of the first wells is less than that of the second wells. To equalize the height of the first and second wells, and thereby planarize the wafer, the height of the second wells is reduced to substantially the same height as the first wells. The second wells can be reduced to the same height as the first wells using wet silicon etching, dry silicon etching, or oxidation followed by oxide removal (etching).

Further features of the invention, its nature and various advantages will be more apparent from the accompanying drawings and the following detailed description of the preferred embodiments.

DETAILED DESCRIPTION OF THE PREFERRED EMBODIMENTS

In order to form a CMOS integrated circuit, closely spaced "wells" must be formed in the body of a silicon wafer. The wells are doped of opposing conductivity types (i.e., one well is doped p-type and the other is doped n-type). The complementary wells are used to form metal oxide semiconductor field-effect transistors.

To achieve the highest possible density of devices on an integrated circuit and to improve device performance, it is desirable to form transistors with lateral dimensions that are as small as possible. However, as dimensions shrink, at least two problems arise. First, it is difficult to maintain the various structures that are formed on an integrated circuit in perfect alignment as the various layers that make up the integrated circuit are deposited, etched, etc. Second, even if alignment is maintained between the levels of an integrated circuit structure, the topography of a wafer can become highly non-planar. If the surface becomes too non-planar, the integrated circuit cannot be fabricated properly.

Figure 1:
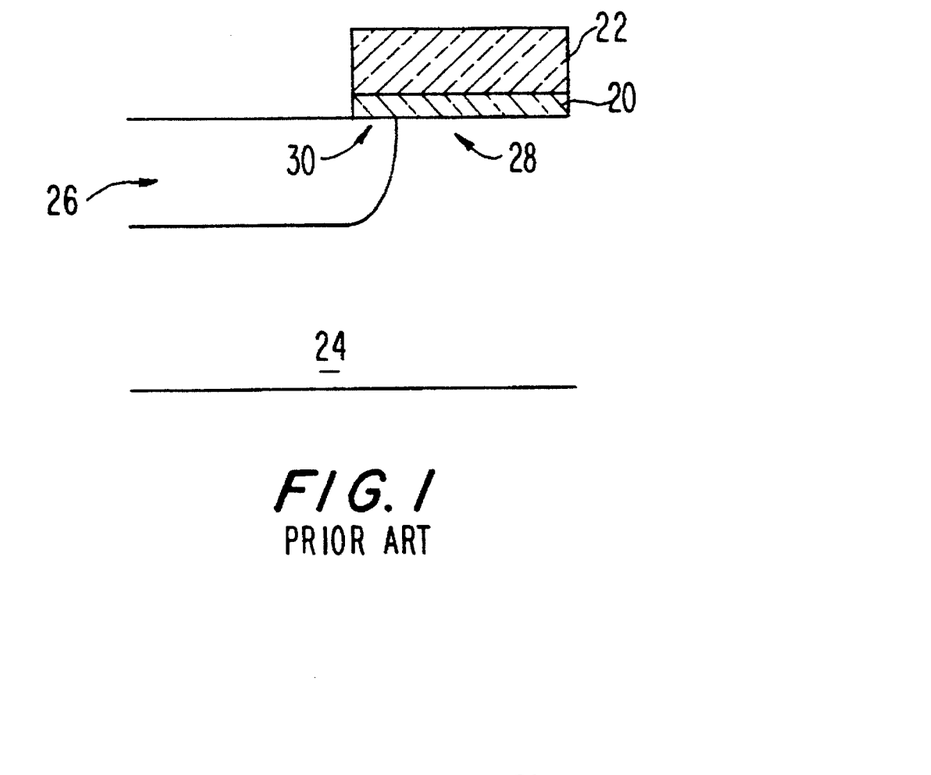
FIGS. 1–3 are cross-sectional diagrams of a conventional self-aligned fabrication process.
Figure 2:
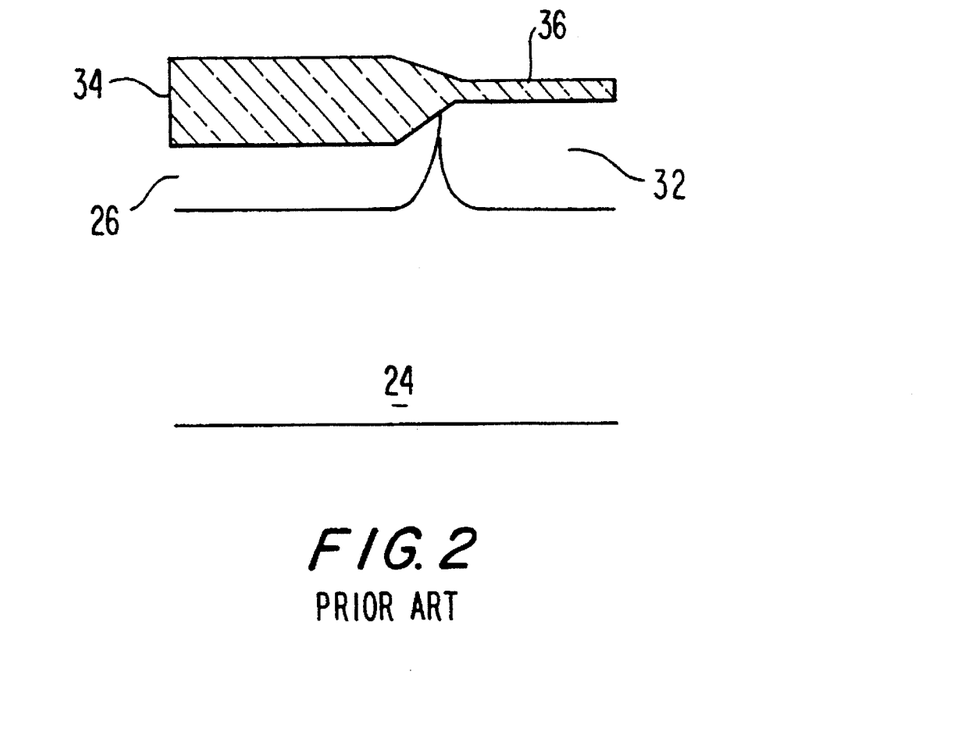
Figure 3:
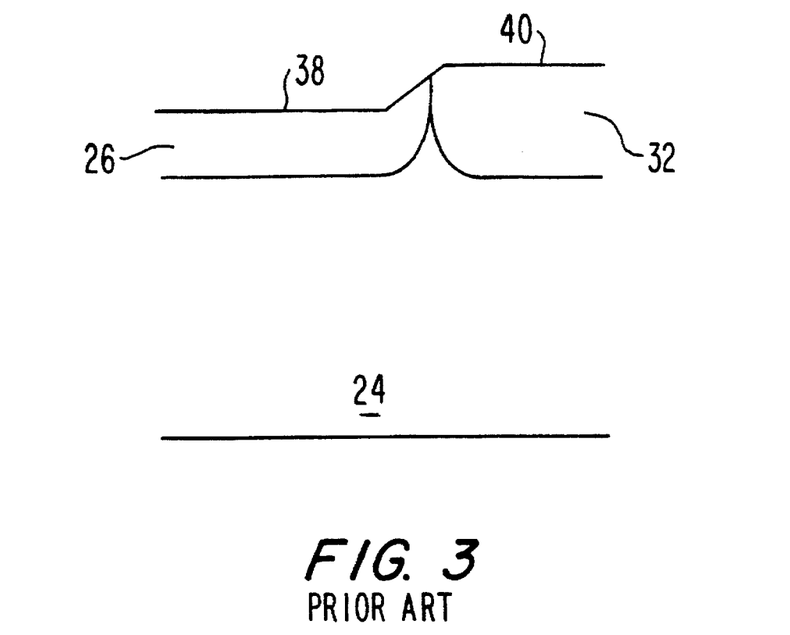

A conventional fabrication process for CMOS integrated circuits is illustrated in FIGS. 1–3. Several fabrication steps are shown in each figure. As shown in FIG. 1, silicon dioxide layer 20 and silicon nitride layer 22 are formed on silicon wafer 24. Initially, layers 20 and 22 are formed over the entire surface area of wafer 24. Layers 20 and 22 are then patterned using standard photolithographic techniques. After patterning, layers 20 and 22 appear as in FIG. 1. Well 26 is formed by implantation or diffusion of impurities of a given conductivity type. Because the silicon region 28 under layers 20 and 22 is protected by the layers 20 and 22, no impurities are implanted or diffuse into region 28. However, there may be a slight lateral encroachment 30 of well 26 underneath the edge of patterned layers 20 and 22 due to impurity diffusion.

Additional processing steps are shown in FIG. 2. In order to protect well 26 while well 32 is doped, a relatively thick oxide layer 34 is grown, while silicon nitride layer 22 is still in place. Because silicon nitride is a barrier to oxygen diffusion into the silicon wafer 24, oxide is prevented from growing under silicon nitride layer 22 (FIG. 1), although some oxidation will occur in the vicinity of the edge of the silicon nitride layer 22 due to oxygen diffusion through oxide layers 20 and 34. Following growth of oxide layer 34, nitride layer 22 (FIG. 1) is removed. Well 32 is formed by impurity implantation or diffusion. Oxide layer 20 is thin enough that dopants may be implanted through oxide layer 20, if desired. Oxide layer 20 can also be removed (e.g., by etching) prior to forming well 32. The impurities used to dope well 32 are of the opposite conductivity type to those used to dope well 26. Oxide layer 34 acts as an implantation or diffusion barrier thereby shielding well 26 during the formation of well 32. With the process of FIGS. 1–3, the defining masking layer for well 32 (layer 34) is automatically aligned with the defining masking layer for well 26 (layers 20 and 22), because layer 34 is grown using layer 22 as a oxidation barrier layer. Accordingly, this approach is known as a "self-aligned" process.

Thin oxide layer 36 is formed from silicon dioxide layer 20 and any additional oxidation that may occur during the various steps of forming well 26, removing silicon nitride layer 22, and forming well 32. As shown in FIG. 3, after well 32 is formed, oxide layers 34 and 36 (FIG. 2) are removed, so that the remaining fabrication steps necessary to form a complete CMOS integrated circuit may be carried out. However, as shown in FIG. 3, there is a difference in the relative "heights," (vertical locations of the surfaces as measured from a common reference point) of wells 26 and 32, because the step of forming oxide layer 34 (FIG. 2) consumes a portion of the underlying silicon in well 26. Accordingly, when using the well formation method of FIGS. 1–3, the surface of silicon wafer 24 becomes non-planar (i.e., surface 38 is not in the same plane as surface 40). Non-planar surfaces are undesirable because such surfaces make photolithography steps difficult. Specifically, it is difficult to optically resolve small structures on non-planar surfaces due to the limited depth-of-field of available photolithography tools.

Figure 4:
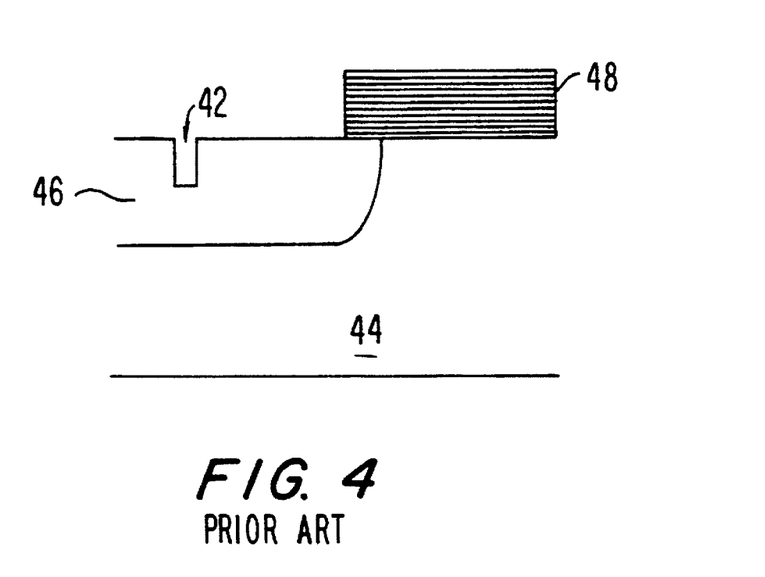
FIGS. 4–6 are cross-sectional diagrams of a conventional fabrication process using alignment marks.
Figure 5:
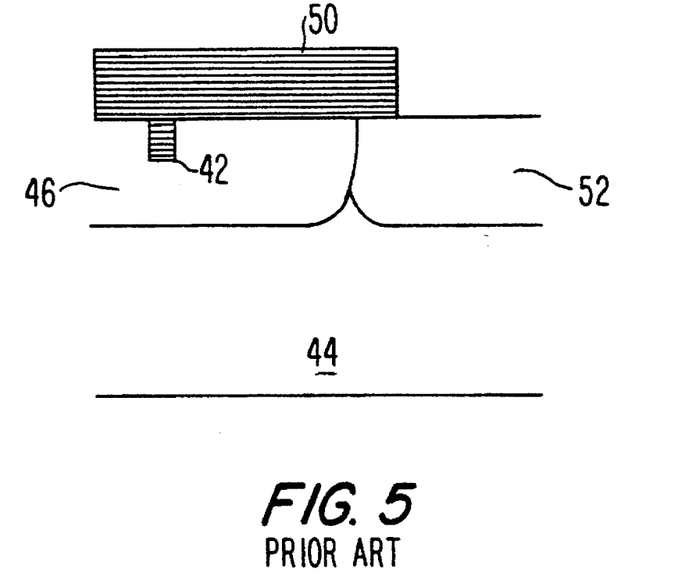
Figure 6:
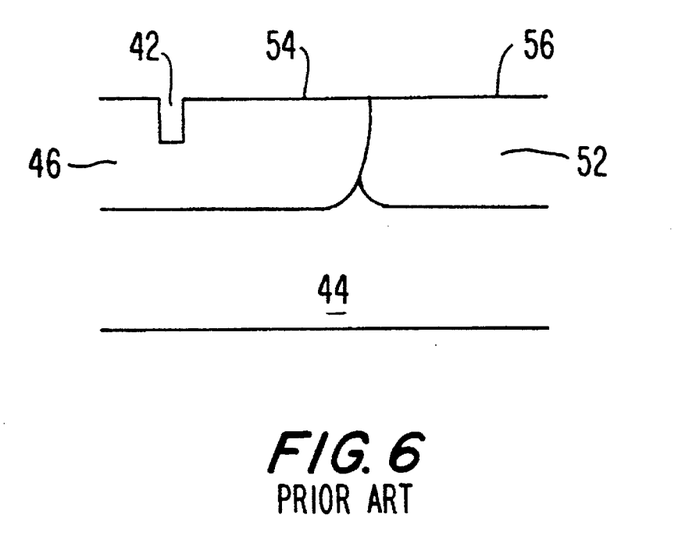

A previously-known fabrication method for forming CMOS planar well structures is illustrated in FIGS. 4–6. As shown in FIG. 4, alignment marks, such as alignment mark 42 are etched into the surface of silicon wafer 44. Subsequent layers are aligned relative to alignment mark 42, which provides a common reference point on the surface of wafer 44. In order to form well 46, for example, masking layer 48 is photolithographically patterned relative to alignment mark 42. Well 46 is formed by implantation or diffusion.

After well 46 is formed, masking layer 48 is removed. As shown in FIG. 5, masking layer 50 is then formed on silicon wafer 44 and patterned, using marks such as alignment mark 42. Well 52 is formed by implantation or diffusion. After well 52 is formed, masking layer 50 is removed, so that the remaining fabrication steps necessary to form a complete CMOS integrated circuit may be carried out. As shown in FIG. 6, because masking layer 50 is not formed by oxidizing silicon wafer 44, no portion of well 46 is consumed by oxide (as with oxide layer 34 of FIG. 2). Surface 54 of well 46 and surface 56 of well 52 are therefore at the same relative surface height. The process steps of FIGS. 4–6 result in a planar surface, which alleviates the effects of non-planar wafer topography. Nevertheless, the process of FIGS. 4–6 necessitates the use of additional process steps (e.g., the photolithographic steps to form alignment marks 42) relative to the process of FIGS. 1–3. Further, because the process of FIGS. 4–6 is not self-aligned, it is more susceptible to misalignment problems.

In accordance with the present invention, wells suitable for forming CMOS circuitry are formed on a silicon wafer using a self-aligned technique that results in a planar wafer surface, yet requires fewer process steps than necessary when using alignment marks. The process of the present invention is shown in FIGS. 7–11.

Figure 7:
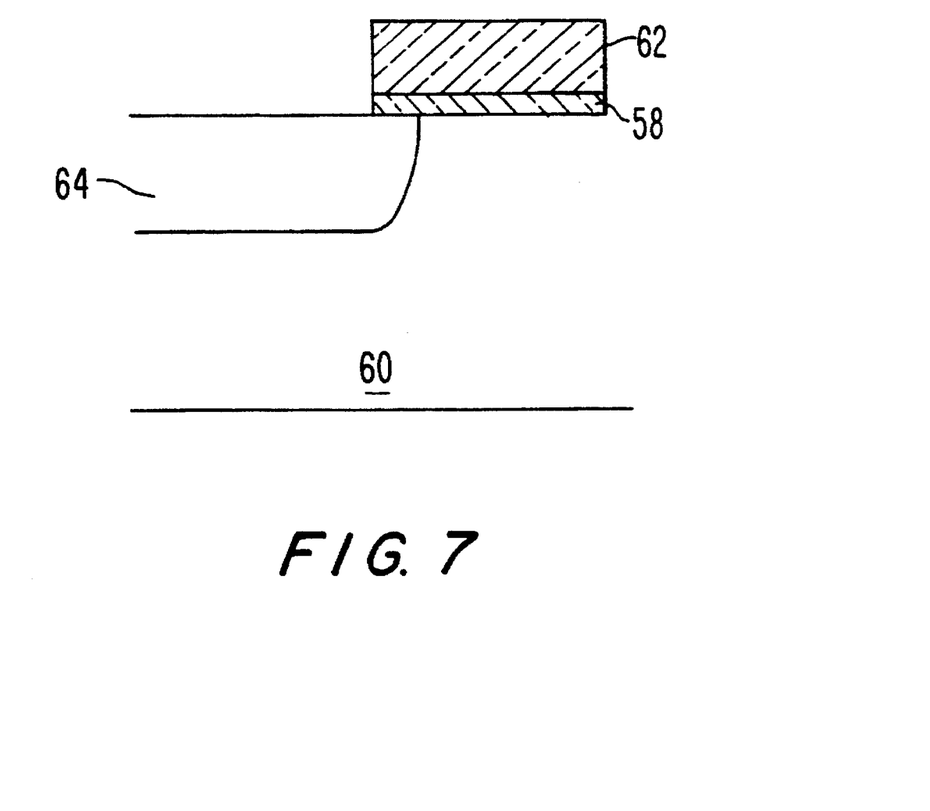
FIGS. 7–11 are cross-sectional diagrams of a fabrication process in accordance with the present invention.

As shown in FIG. 7, a barrier layer formed of silicon dioxide layer 58 and silicon nitride layer 62 is formed on silicon wafer 60. Any suitable technique may be used to form these layers. For example, silicon oxide layer 58 may be formed using thermal oxidation. Silicon nitride layer 62 may be formed by chemical vapor deposition.

Silicon nitride layer 62 acts as a barrier to oxygen diffusion to silicon 60 beneath layer 62. Any suitable film may be used for this purpose. If the oxygen diffusion barrier layer is formed from silicon nitride layer 62, silicon dioxide layer 58 is preferably used to provide a mechanical stress relief layer. If desired, layer 58 may be made up of multiple layers of silicon dioxide and silicon nitride.

Silicon nitride layer 62 and silicon dioxide layer 58 are patterned using conventional photolithographic and etching techniques. For example, silicon nitride can be patterned using a radio-frequency (RF) plasma with a chlorine or fluorine chemistry. Silicon nitride layer 62 and silicon dioxide layer 58 form a dopant barrier layer, so that dopants only penetrate the surface of wafer 60 where wafer 60 is not covered by nitride and oxide layers 62 and 58. Well 64 can therefore be selectively doped using conventional implantation or diffusion methods. If desired, the photoresist (not shown) used to pattern nitride layer 62 may be left in place during implantation.

Figure 8:
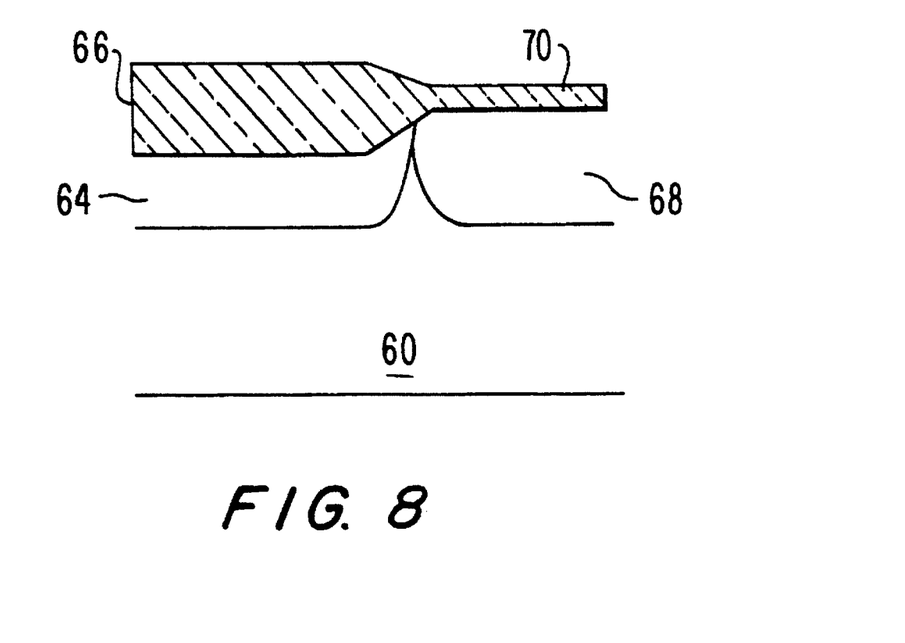

After forming well 64, silicon wafer 60 is oxidized to form silicon dioxide layer 66, as shown in FIG. 8. Oxide layer 66 (FIG. 8) can be formed by "wet" thermal oxidation, high-pressure oxidation, or other suitable techniques. With wet thermal oxidation, silicon wafer 60 is exposed to oxygen and water vapor at elevated temperatures. During the oxidation process, silicon nitride layer 62 acts as an oxidation barrier, so that only the portion of silicon wafer 60 not covered by silicon nitride layer 62 is oxidized. As shown in FIG. 8, because oxide layer 66 is formed on top of well 64, a portion of the silicon of well 64 is consumed by oxide layer 66 during the oxide formation process. In contrast, well 68 is protected by the silicon nitride layer 62 (FIG. 7). Accordingly, after the formation of oxide layer 66, the height (vertical location of the surface relative to a fixed reference point) of well 64 is less than that of well 68. Following the formation of oxide layer 66, silicon nitride layer 62 (FIG. 7) may be removed, for example, by etching in a solution of phosphoric acid. During the removal of silicon nitride layer 62, a small portion of silicon dioxide layer 58 (FIG. 7) may be removed. The silicon dioxide layer after nitride removal—silicon dioxide layer 70 of FIG. 8—is approximately 70–400 Å thick.

Well 68 is formed by conventional implantation or diffusion techniques. Oxide layer 66 acts as an implantation or diffusion barrier during the formation of well 68. Because silicon dioxide layer 70 is fairly thin, dopants may be implanted through silicon dioxide layer 70. If desired, silicon dioxide layer 70 may be removed prior to implantation using conventional techniques. If well 68 is formed by diffusion (using, e.g., POCl$_3$), silicon dioxide layer 70 is removed to allow dopant to diffuse into well 68. Suitable techniques for removing silicon dioxide layer 70 include using an etchant such as hydrofluoric acid or a dry RF etch chemistry such as CHF$_3$. For CMOS circuits, wells 64 and 68 are doped with dopants of opposing conductivity types. Thus, if well 64 is n-type, then well 68 is p-type.

Figure 9:
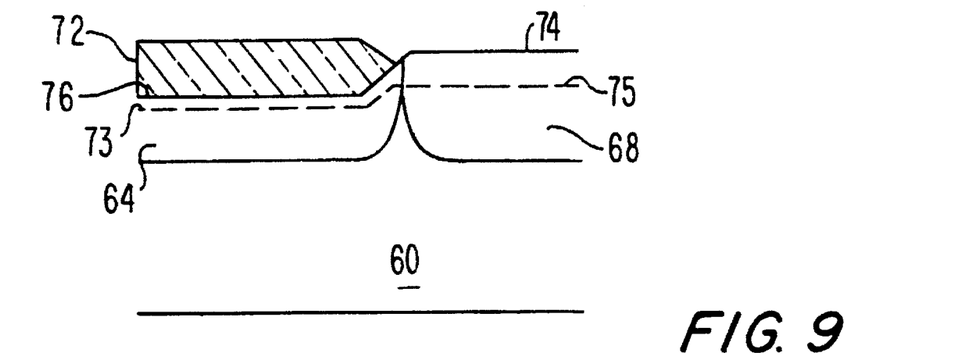

If silicon dioxide layer 70 is not removed prior to the formation of well 68, then silicon dioxide layer 70 is removed after well 68 is formed by using a suitable etchant such as hydrofluoric acid. The entire silicon wafer 60 is exposed to etchant, so layer 66 (FIG. 8) is exposed to etchant at the same time that thin oxide layer 70 (FIG. 8) is exposed to etchant. As shown in FIG. 9, wafer 60 is preferably etched sufficiently to completely remove oxide layer 70 (FIG. 8), while only partially etching oxide layer 66 (FIG. 8). Etching reduces the thickness of oxide layer 66 (FIG. 8). The etched oxide is therefore referred to as oxide layer 72 in FIG. 9.

Oxide layer 72 forms a barrier layer over well 64. Because oxide layer 70 has been completely removed, surface 74 over well 68 is exposed. Accordingly, the height of well 68 can be reduced to that of well 64 by etching well 68. Any suitable etching technique may be used to etch well 68, such as wet silicon etching with an appropriate silicon etchant, dry silicon etching in a plasma or reactive-ion etcher, or oxidation of well 68 followed by silicon dioxide etching.

If the height of well 68 is to be reduced using a silicon etching technique, oxide layer 72 can be used to form a barrier that prevents the silicon of well 64 from being etched during the silicon etching of well 68. If the height of well 68 is reduced by oxidizing well 68 (e.g., by wet thermal oxidation of well 68) followed by a removal of the portion of well 68 that becomes oxidized, oxide layer 72 is not used to form an absolute barrier to the oxidation of well 64, but rather to reduce the oxidation rate of well 64 relative to that of well 68. As is well known, with oxide layer 72 in place, surface 74 of well 68 will oxidize more rapidly than the surface 76, because the oxidation rate for silicon oxide layers becomes progressively slower as the thickness of the existing oxide increases. For example, after a predetermined amount of oxidation, well 64 oxidizes to the depth shown by 73, whereas well 68 oxidizes to the extent shown by line 75. After the oxides on wells 64 and 68 (lower bounds given by lines 73 and 75, respectively) are removed, for example, by etching in hydrofluoric acid, well 64 and well 68 are substantially the same height.

Figure 10:
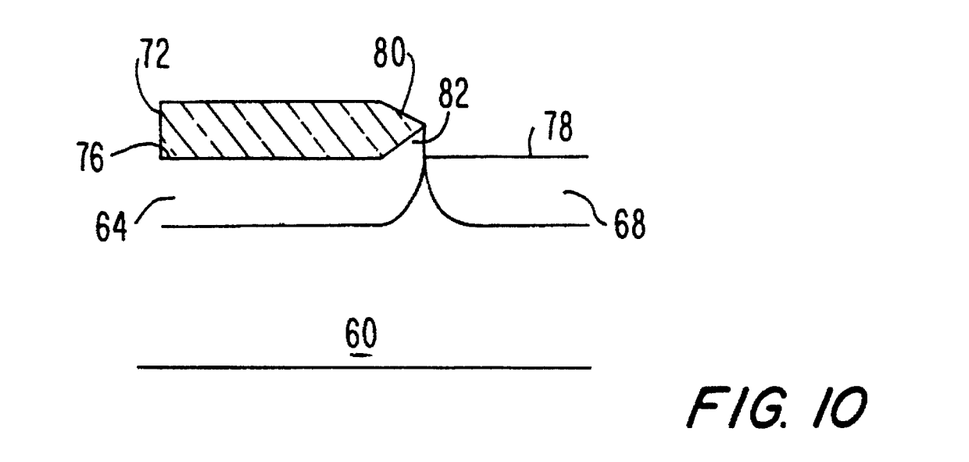

The relative heights of surface 76 of well 64 and surface 78 of well 68 after the height of well 68 has been reduced to that of well 64 by silicon etching are shown in FIG. 10. Oxide layer 72 typically has a transition region 80, which is thinner, and therefore consumes less of the underlying silicon of well 64, than the remainder of oxide layer 72. As a result, region 80 leads to the formation of small non-planar surface feature 82, which protrudes slightly from the surface of silicon wafer 60. The small non-planar surface feature 82 can be used as an alignment mark in subsequent lithographic process steps (e.g., ultraviolet, deep ultraviolet, x-ray, or e-beam exposures). Alignment marks are commonly required in order to align subsequent mask levels to previously fabricated circuit patterns on the silicon wafer.

Figure 11:
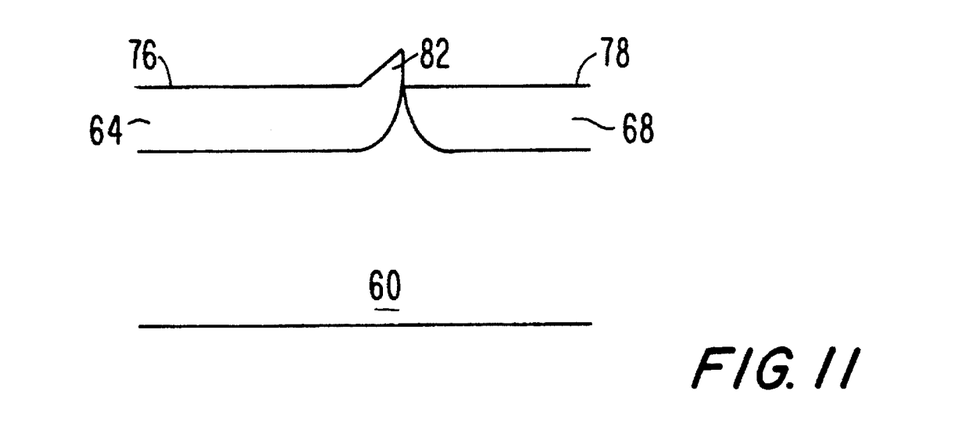

Following the step of etching well 68 to reduce the height of well 68 to that of well 64, the oxide layer 72 is removed using a suitable technique, such as etching in hydrofluoric acid. The resulting surface of wafer 60 appears as shown in FIG. 11. Although feature 82 may interrupt the planarity of the surface of wafer 60 slightly (which allows feature 82 to be used as an alignment mark), surfaces 76 and 78 are planar, resulting in a significant improvement in the topography of wafer 60 and therefore in the ease with which subsequent layers of an integrated circuit may be formed on wafer 60. To form a complete CMOS integrated circuit, wafer 60 of FIG. 11 may be processed further using conventional fabrication techniques.

The foregoing is merely illustrative of the principles of this invention and various modifications can be made by those skilled in the art without departing from the scope and spirit of the invention.

What is claimed is:

1. A method of fabricating a substantially planar integrated circuit structure with first and second self-aligned wells comprising the steps of:

providing a silicon wafer;

forming a first dopant and oxidation barrier layer on said silicon wafer;

doping said silicon wafer with a first dopant type to form said first wells, said first barrier layer preventing the doping of said silicon wafer with said first dopant type except in said first wells;

forming a second barrier layer by oxidizing said silicon wafer, said first barrier layer preventing formation of said second barrier layer except on regions of said silicon wafer not covered by said first barrier layer;

removing at least a portion of said first barrier layer after said second barrier layer is formed;

doping said silicon wafer with a second dopant type opposite to said first dopant type to form said second wells, said second barrier layer preventing the doping of said silicon wafer with said second dopant type except in said second wells, wherein said first wells have a first well height and said second wells have a second well height, said step of forming said second barrier layer lowering said first well height to less than said second well height; and reducing said second well height to substantially said first well height.

2. The method defined in claim 1 wherein said step of reducing said second well height to said first well height further comprises the step of etching said second wells with said second barrier layer in place until said second well height substantially equals said first well height.

3. The method defined in claim 2 wherein said step of etching said second wells comprises the step of etching said silicon wafer with a silicon etchant.

4. The method defined in claim 2 wherein said step of reducing said second well height to said first well height further comprises the step of exposing said second wells prior to etching said second wells.

5. The method defined in claim 2 wherein said step of etching said second wells comprises the step of dry etching said silicon wafer.

6. The method defined in claim 5 wherein said step of dry etching said wells comprises the step of plasma etching said second wells.

7. The method defined in claim 5 wherein said step of dry etching said wells comprises the step of reactive-ion etching said second wells.

8. The method defined in claim 1 wherein said step of reducing said second well height to said first well height comprises the steps of:

oxidizing said silicon wafer with said second barrier layer in place, so that a second well oxide layer forms on said second wells; and removing said second well oxide layer, such that said second well height is reduced to substantially said first well height.

9. The method defined in claim 1 wherein said step of forming said first barrier layer comprises the steps of:

forming a silicon dioxide layer on said silicon wafer; and forming a silicon nitride layer on said silicon nitride layer.

10. The method defined in claim 1 wherein the step of forming said second barrier layer by oxidizing said silicon wafer comprises the step of oxidizing a first portion of said silicon wafer adjacent to said first barrier layer to a greater extent than a second portion of said silicon wafer non-adjacent to said first barrier layer, so that when said second barrier layer is removed said first portion of said silicon wafer protrudes slightly from the surface of said silicon wafer relative to said second portion.

* * * * *

UNITED STATES PATENT AND TRADEMARK OFFICE
CERTIFICATE OF CORRECTION

PATENT NO. : 5,523,247
DATED : June 4, 1996
INVENTOR(S) : Peter Wright

It is certified that error appears in the above-identified patent and that said Letters Patent is hereby corrected as shown below:

Column 7, Line 1, "said silicon nitride layer" should be --said silicon dioxide layer--.

Column 7, Line 5, "greater" should be --lesser--.

Signed and Sealed this

Sixteenth Day of March, 1999

Attest:

Attesting Officer

Q. TODD DICKINSON

Acting Commissioner of Patents and Trademarks